United States Patent [19]

Jackson et al.

[11] 4,350,955

[45] Sep. 21, 1982

[54] MAGNETIC RESONANCE APPARATUS

[75] Inventors: Jasper A. Jackson; Richard K. Cooper, both of Los Alamos, N. Mex.

[73] Assignee: The United States of America as represented by the United States Department of Energy, Washington, D.C.

[21] Appl. No.: 195,968

[22] Filed: Oct. 10, 1980

[51] Int. Cl.³ ............................................. G01N 27/00
[52] U.S. Cl. ..................................... 324/303; 324/319
[58] Field of Search ............... 324/300, 303, 319, 346, 324/220, 221

[56] References Cited

U.S. PATENT DOCUMENTS 3,083,335  3/1963  Schuster .
3,597,681  8/1971  Huckabay .......................... 324/303
3,775,671 11/1973  Brown .

Primary Examiner—Michael J. Tokar
Attorney, Agent, or Firm—Jerome B. Rockwood; Paul D. Gaetjens; Richard G. Besha

[57] ABSTRACT

Means for producing a region of homogeneous magnetic field remote from the source of the field, wherein two equal field sources are arranged axially so their fields oppose, producing a region near the plane perpendicular to the axis midway between the sources where the radial component of the field goes through a maximum. Near the maximum, the field is homogeneous over prescribed regions.

13 Claims, 6 Drawing Figures

MAGNETIC RESONANCE APPARATUS

This invention is the result of a contract with the Department of Energy (Contract No. W-7405-ENG-36).

BACKGROUND OF THE INVENTION

The present invention relates to nuclear magnetic resonance, and more particularly, to an apparartus and method for nuclear magnetic resonance and analysis of specimens remote from the source of a homogeneous polarizing magnetic field.

The phenomenon of nuclear magnetic resonance was discovered about 1948. Soon thereafter it became apparent that nuclear magnetic resonance has applications in connection with well-logging since with NMR techniques it is possible to derive a signal from fluids in rock pores and not from the rock itself. Previously known nuclear magnetic logging apparatus have employed the approach characterized by tipping magnetic nuclei, such as hydrogen nuclei in oil or water, away from their original alignment with the earth's magnetic field by application of a strong dc magnetic field produced by passing a current through a coil in the well-logging tool. This magnetic field was then reduced to zero as rapidly as possible. The hydrogen nuclei then rotates about the earth's magnetic field at a characteristic frequency of about 2 kHz in the one-half gauss magnetic field strength of the earth. These rotating nuclear magnets induce a 2 kHz voltage in a receiver coil included in the well-logging tool. Due to the relatively low strength of the earth's magnetic field, the signal-to noise ratio is extremely low.

Other practical problems are also apparent. For example the dc current in the coil employed to produce a magnetic fringe field to rotate the hydrogen nuclei in the water or hydrocarbons cannot be reduced to zero in less than about 20 milliseconds. This 20 millisecond period cannot be used for measuring purposes and is termed "recovery time". A recovery time this long results in much important information from the precessing nuclei being lost. Since the signal-to-noise ratio varies approximately as the strength of the magnetic field to the three halves power, sensitivity decreases rapidly with decreasing field. Therefore it is apparent that the weak earth's field results in extremely low signal-to-noise ratio. Furthermore, this approach does not allow measurement of important relaxation times associated with nuclear resonance. Knowledge of these relaxation times, to achieve certain states of equilibrium following a disturbance, is essential for extracting information about molecular diffusion of the molecular environment.

The most severe practical drawback in previously known nuclear magnetic logging apparatus is the overwhelming signal from the drilling mud in the borehole. This signal, from water protons, almost completely masks any signal of interest from the formation. This problem was solved heretofore by the procedure of adding chemicals to the borehole fluid to suppress the unwanted signal. Since this procedure can take many hours, no other logs can be run and of course no drilling can take place. As best, previously known nuclear magnetic logging tools were limited in range to the area of the formation within about an inch from the borehole.

Other nuclear magnetic resonance techniques have been employed in the laboratory. A large uniform magnetic field is obtained at the sample by placing the sample between the poles of a large magnet. The nuclei will rotate (or "precess") about the applied field at a characteristic frequency (called the "Larmor" frequency). For hydrogen nuclei (protons) the characteristic frequency is 4.25 kHz per Gauss of applied field. Thus, in a typical laboratory magnet field of 10,000 Gauss the frequency is ~ 42.5 MHz. If a radio frequency magnetic field is applied perpendicular to the polarizing dc field, and if the frequency of the rf field is adjusted to the same frequency as the rotating nuclei (adjusted to be in "resonance"), some of the muclei can accept energy from the rf field and be "flipped" so as to be aligned against the field direction. An rf field at the sample is obtained by means of an rf coil surrounding the sample. Either a continuous rf field or rf pulses may be employed. Of particular interest is the employment of short pulses of rf power at the characteristic Larmor frequency. The observation of the nuclear spin system is made after the rf is turned off, when the voltage induced in a receiver coil by the precessing nuclei is recorded and analyzed.

Pulse methods are often much more efficient than those obtained by sweeping the rf frequency. Relaxation plays an important role in pulse experiments, and as a result pulse techniques provide the most generally useful method of measuring relaxation times. Pulse methods permit measurement of relaxation times for individual NMR lines and complex molecules. Sophisticated pulse techniques have been developed for NMR chemical analysis applications. Such pulse methods are discussed in "Pulse and Fourier Transform NMR: Introduction to Theory and Methods," Thomas C. Ferrar and Edwin D. Becker, published 1971 by Academic Press.

SUMMARY OF THE INVENTION

In the present invention, the nuclei are oriented, not to the earth's field, as in the prior art, but to a much stronger magnetic field produced in the formation by dc energized coils or permanent magnets in a logging tool. The nuclei rapidly realign themselves from their direction along the earth's field to a new direction along the strong applied field. The nuclei are then "flipped" away from the strong field by a radiofrequency magnetic field produced by a transmitting coil in the tool. Afer being flipped, the nuclei revolve or precess at high frequency around the strong field until they relax to their original direction along the strong field with a relaxation time characteristic of their environment.

In the present invention means are disclosed for "focusing" a toroidal or donut-shaped region of homogeneous magnetic field to an arbitrary distance up to approximately 60 cm into the formation from the well-bore. The distance into the formation is controlled by adjusting the separation between two magnets used to produce the magnetic field, allowing the nuclei to be tipped selectively by the RF pulse only in this toroidal region, which may be called the resonance region, since only in this homogeneous region is the rf field synchronous or in resonance with the rotating nuclei. The signal from the precessing nuclei is then picked up by a coil in the tool, following the turn-off of the rf pulse.

A well known requirement for generating an observable NMR signal is a relatively homogeneous magnetic field across the sample volume in order that the precessional frequencies of the nuclei within the sample will be relatively uniform.

Previous attempts to "focus" a region of NMR sensitivity into the formation using a non-uniform field (e.g., a magnetic dipole) which decreases rapidly and monotonically with increasing distance from the axis suffer from the fact that the radial width of a sample volume within which the magnetic field homogeneity is good enough to support NMR is extremely small. Such schemes, therefore, cannot produce observable NMR signals, in contrast with the device disclosed hereinabove which utilizes a finite region of remotely produced homogeneous field.

Several advantages over the prior art result from the method and structure of the present invention. Exemplarily, by focusing the resonance region into the formation, no signal is produced from the fluid, such as drilling mud, in the borehole, and the costly procedures presently in use to eliminate it are unncessary. Formations may be investigated considerably further from the borehole than in the previous art, exemplarily two feet versus the one inch maximum in prior art equipment. Deadtime is reduced by a factor of 100 before receiving the nuclear signal since the radiofrequency field used to tip the nuclei can be turned off much faster than the turn-off time of the strong dc magnetic field employed in previous tools. This enables measurement of species with shorter relaxation times, and enables logging "tight" geologic formations with small pore sizes since relaxation time varies with pore size. The strength of the field in the homogeneous magnetic field region is 100 to 1000 times of that of the earth's field, and therefore the signal-to-noise ratio is improved greatly. In addition vertical resolution of less than three inches is obtainable. Therefore, it enables fractures to be mapped, or to pinpoint high production zones. Since pulsed radiofrequency magnetic fields are employed to tip the nuclei, sophisticated NMR techniques normally used only in laboratory NMR may be employed in measuring properties of the formation outside the borehole. By employing suitable combinations of NMR signal strength, signal shape, and relaxation time measurements, using techniques commonly used in laboratory NMR analysis, but previously not practicable in well logging, many of the important parameters of the formation may be determined. These include measurements of formation fluid type, free-fluid index, porosity, permeability, coefficients of self and bounded diffusion, pore size, pore size distribution, and pore configuration.

OBJECT OF THE INVENTION

It is therefore an object of the present invention to provide an NMR device enabling measurements at a distance from the device itself.

Another object of the present invention is to provide means generating a toroidal region of homogeneous magnetic field at a distance from the magnets producing the field.

Another object of the present invention is to provide a well-logging tool enabling NMR measurements of formations at a distance from the borehole.

Another object of the present invention is to provide an NMR device having a high signal-to-noise ratio through the employment of a strong remote magnetic field.

Another object of the present invention is to provide a well-logging tool enabling application of sophisticated NMR pulse techniques for determination of properties of the formation rocks and fluids contained therein.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the invention, as embodied and broadly described herein, the nuclear magnetic resonance device and method of the present invention may comprise a pair of spaced coaxial magnets having like poles adjacent to one another to provide a toroidal region of homogeneous magnetic field at a radial distance from the coaxial magnets, and an rf coil adapted to transmit a pulse of rf energy into the toroidal region of homogeneous field, and means to receive the NMR relaxation signal after termination of the pulsed rf field.

DETAILED DESCRIPTION OF THE INVENTION

Figure 1:
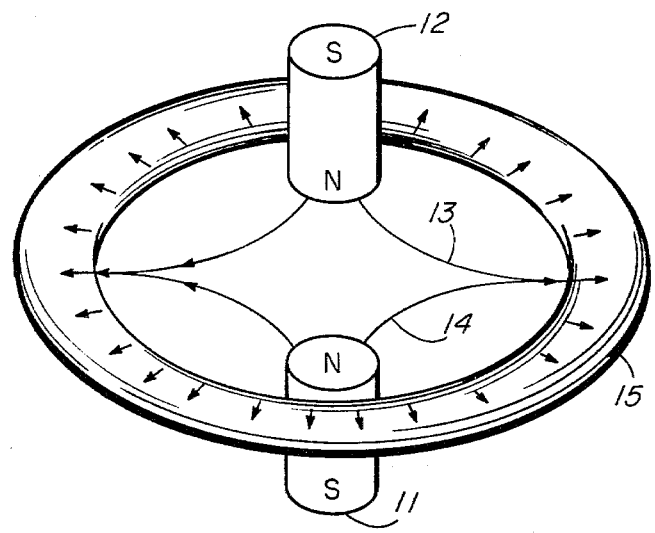
FIG. 1 illustrates generally the production of a toroidal region of homogeneous radial magnetic field coaxial with a pair of axially aligned magnets having like adjacent poles.

Referring now to FIG. 1, a pair of cylindrical permanent magnets 11 and 12 are placed coaxially with like poles facing one another. The opposing magnetic fields, illustrated schematically as 13 and 14, combine to form a toroidal region 15 of relatively homogeneous radial magnetic field. It will be clearly apparent to those skilled in the art that the identical homogeneous radial field area 15 can be obtained if magnets 11 and 12 are dc energized electromagnets, or superconducting dc electromagnets. The distance of the homogeneous radial field from the axis of the magnets is dependent upon the strength of the magnets and the distance between like poles.

The magnetic field of a solenoid, a uniformly magnetized permanent magnet, or a uniformly magnetized electromagnet can be readily calculated by replacing the azimuthal amperian or conduction current distribution by a fictitious magnetic charge distribution occupying the end faces of the solenoid or magnetic materials. The scalar magnetic potential, on the symmetry axis z, of one of the end faces, taken to have magnetic charge density o and radius a, is given by $$d = 2\pi\rho z\{(1+a^2/z^2)^{\frac{1}{2}} - 1\}.$$

By expanding this expression in inverse powers of z one obtains an expression that will determine the coefficients of a spherical polar coordinate expression for the potential, the first few terms of which are $$\phi(r,\theta) = 2\pi\sigma\left\{\tfrac{1}{2}\frac{a^2}{r^2} - \tfrac{1}{8}\frac{a^4}{r^3}P_2(\cos\theta) + \right.$$

$$\left. -\frac{1}{16}\frac{a^6}{r^5}P_4(\cos\theta) - \ldots\right\}$$

In this expression, valid for r>a, the magnetic charge is centered at the origin of coordinates, r is the distance from the origin to the point of observation of the field, and the P's are Legendre polynomials. By superposing such potentials due to charge disks at the ends of the solenoids, permanent magnets, or electromagnets, one can obtain an expression for the magnetic scalar potential which, when the gradient vector operation is performed on it, will yield the magnetic field vector strength at any point in space greater than the distance a from the symmetry axis (the region of interest in this application).

Figure 2:
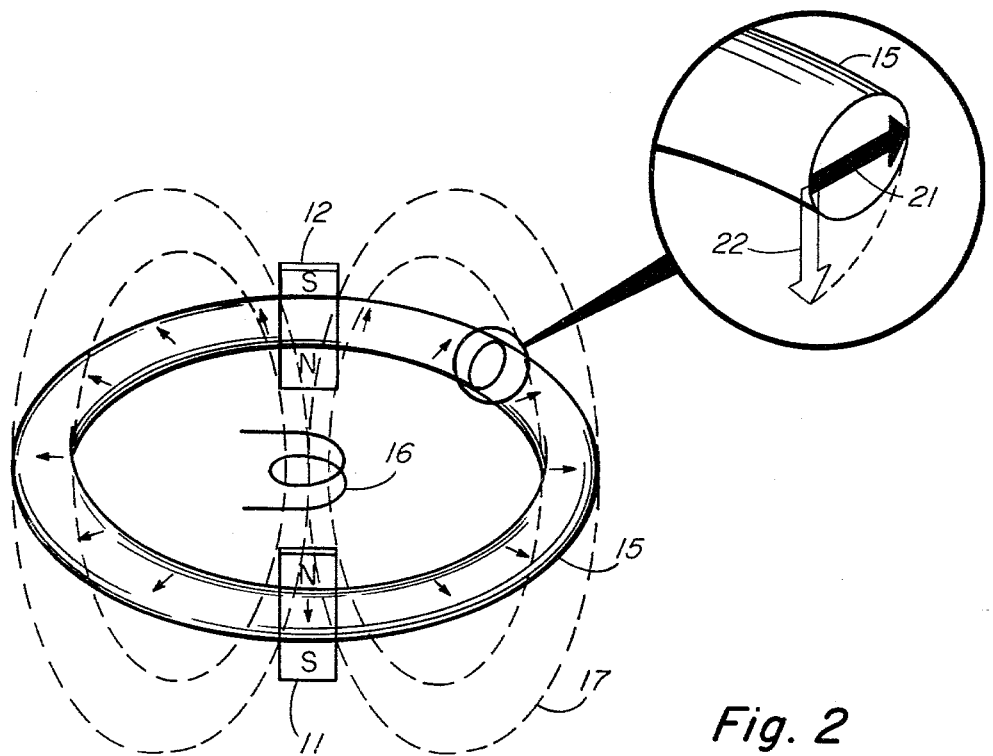
FIG. 2 illustrates the application of a pulsed rf field to the magnetization, a specimen within the toroidal homogeneous field.

In FIG. 2, magnets 11 and 12 set up a toroidal region in which the magnetic field $H_r$ is uniform and suitable for NMR logging. An rf coil 16, connected to a suitable rf pulse transmitter, not illustrated in FIG. 2, sets up an rf field illustrated by dashed lines 17. Upon application of the rf pulse from coil 16, the angle of $M_o$ is rotated 90° to position 22. At the termination of the pulsed rf field from coil 16, the magnetization $M_o$ precesses about the path illustrated by dashed line 23, coming to rest with its vector along axis 21. The precessing magnetization generates an oscillating magnetic field, schematically illustrated at 24, and inducing an NMR signal in rf coil 16.

Figure 3:
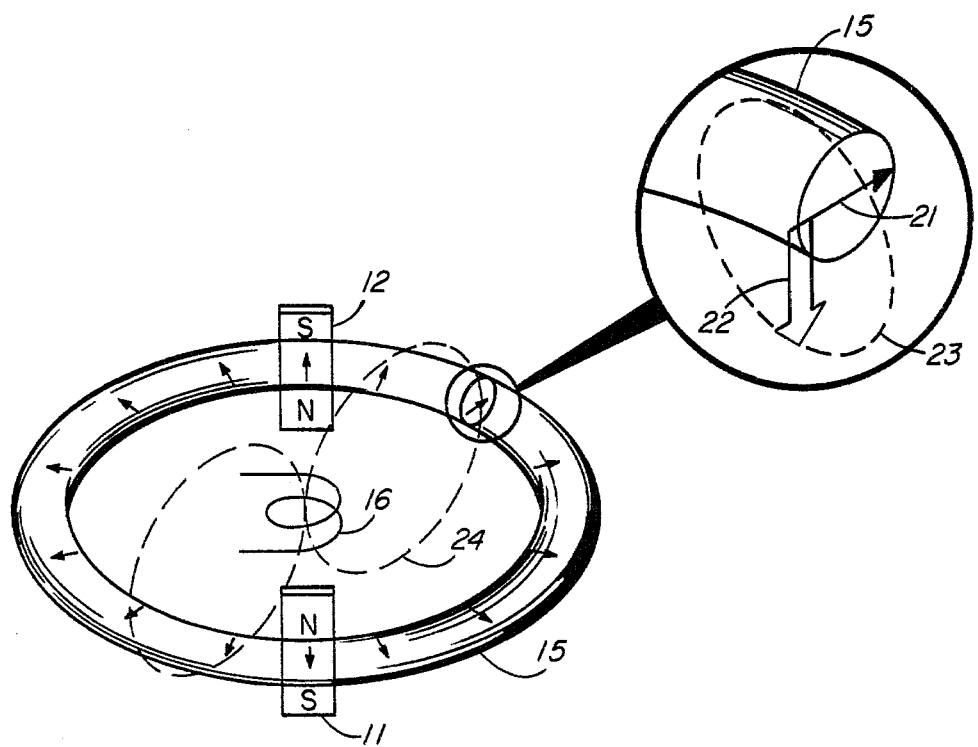
FIG. 3 illustrates the precession of the magnetization in the toroidal homogeneous field after removal of the rf field, and the signal generated by the precessing nuclear magnetization.
Figure 4:
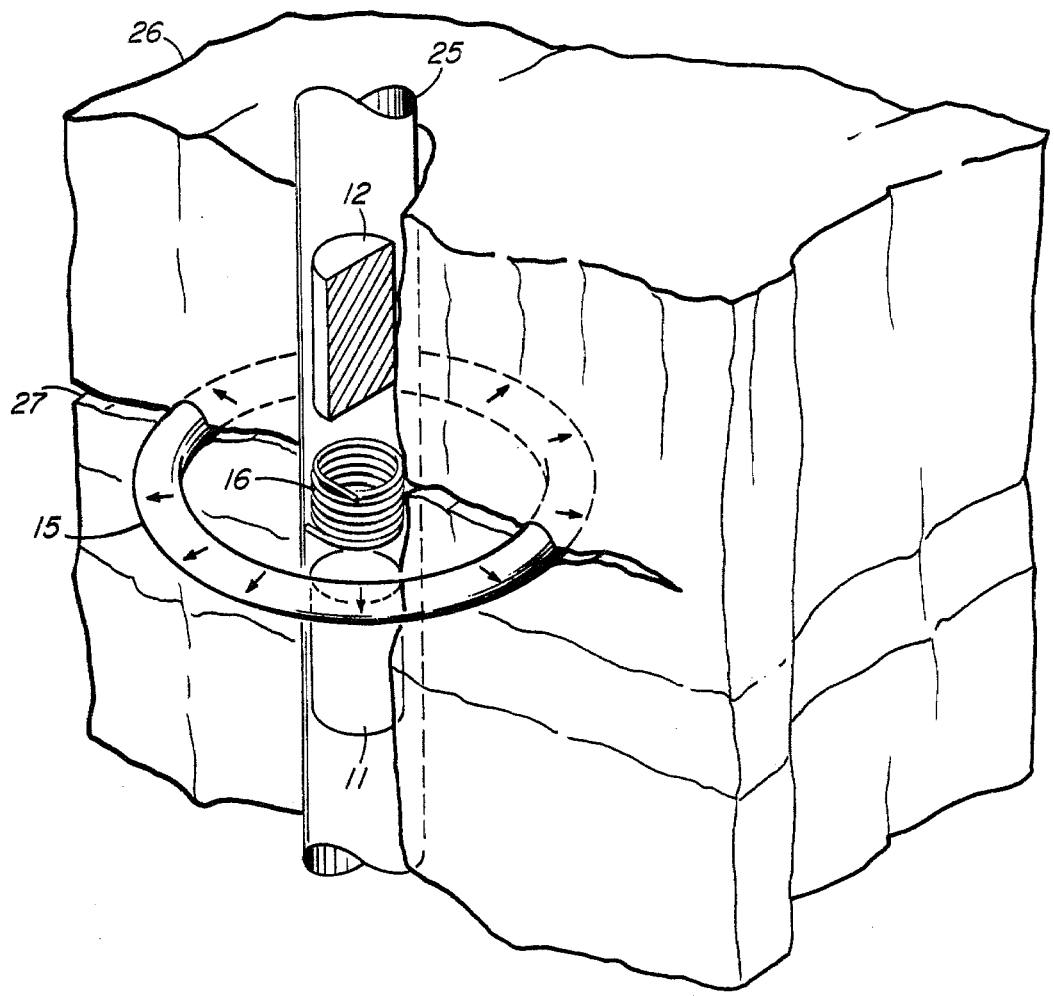
FIG. 4 illustrates the application of the present invention investigating the properties of a geological formation about a well borehole.

A typical downhole instrumentation package is illustrated in FIG. 4. A well-bore 25 is drilled in a typical geological formation 26. Exemplarily a fracture 27 or rock pores, not shown, are filled with fluid, typically a hydrocarbon or water. The hydrogen nuclei in the fluid are aligned by the toroidal region of constant magnetic field 15, generated by magnets 11 and 12. The rf field at the resonance frequency of the hydrogen nucleus in the homogeneous field region rotates $M_o$ by 90° as illustrated in FIG. 3. Upon completion of the rf pulse, $M_o$ precesses about the direction of the applied field generating an oscillating magnetic field at its characteristic "Larmor" frequency, which is the same as the rf frequency pulse from coil 16. The oscillating magnetic field from $M_o$ is picked up by coil 16 and the rf signal is transferred to the surface for processing. For an incremental volume of the toroid at a given azimuth, there is a corresponding volume at an azimuthal direction diametrically opposite. The horizontal (radial) components of the voltage induced in the coil from these two incremental volumes are 180° out of phase and therefore cancel each other, whereas the axial components are in phase and add together to give an oscillating voltage. This analysis can be extended to the entire toroidal sample.

Figure 5:
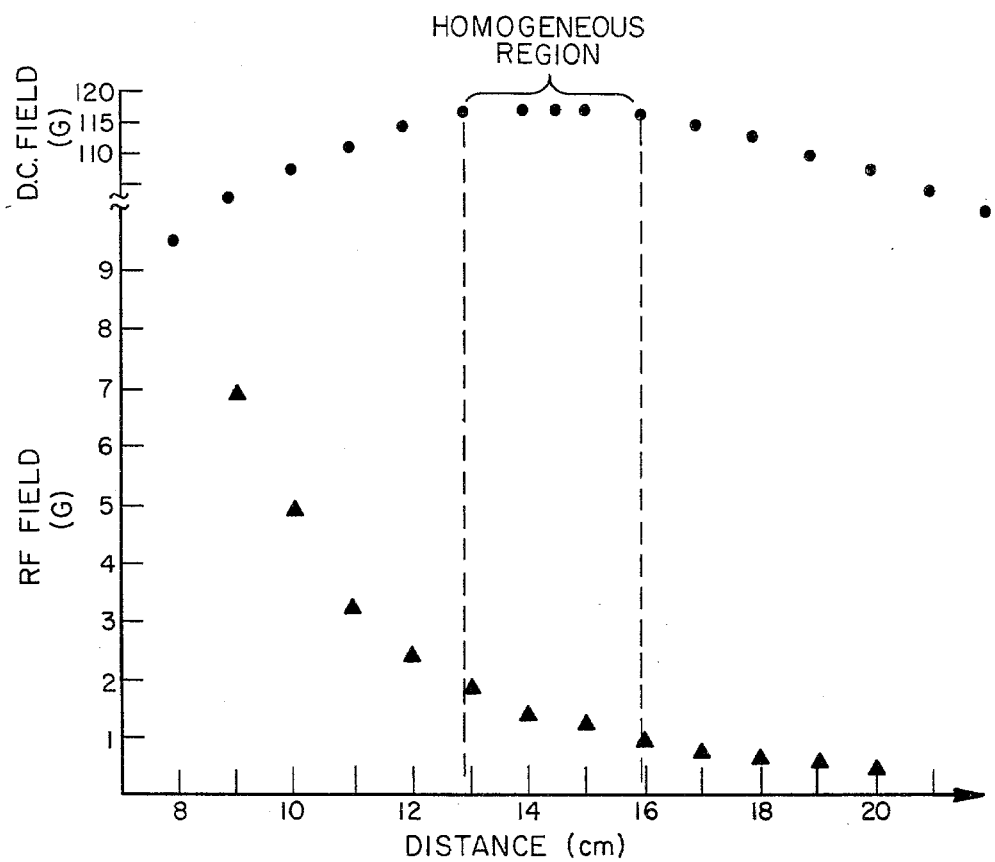
FIG. 5 illustrates the relationship of dc field with distance from the central axis of the magnets, and the strength of the rf field in the area of the homogeneous magnetic field.

FIG. 5 graphically illustrates the measured toroidal region of homogeneous field located at a distance from the axis of the borehole. The upper curve in FIG. 5 illustrates the homogeneous region of approximately 117 gauss at a distance ranging from approximately 13 to 16 cm from the axis. The magnetic component of the rf field, exemplarily at a frequency of 0.5 MHz for the dc magnetic field of interest, provides a field of between 1 and 2 gauss at the distance corresponding to the region of homogeneous field.

Figure 6:
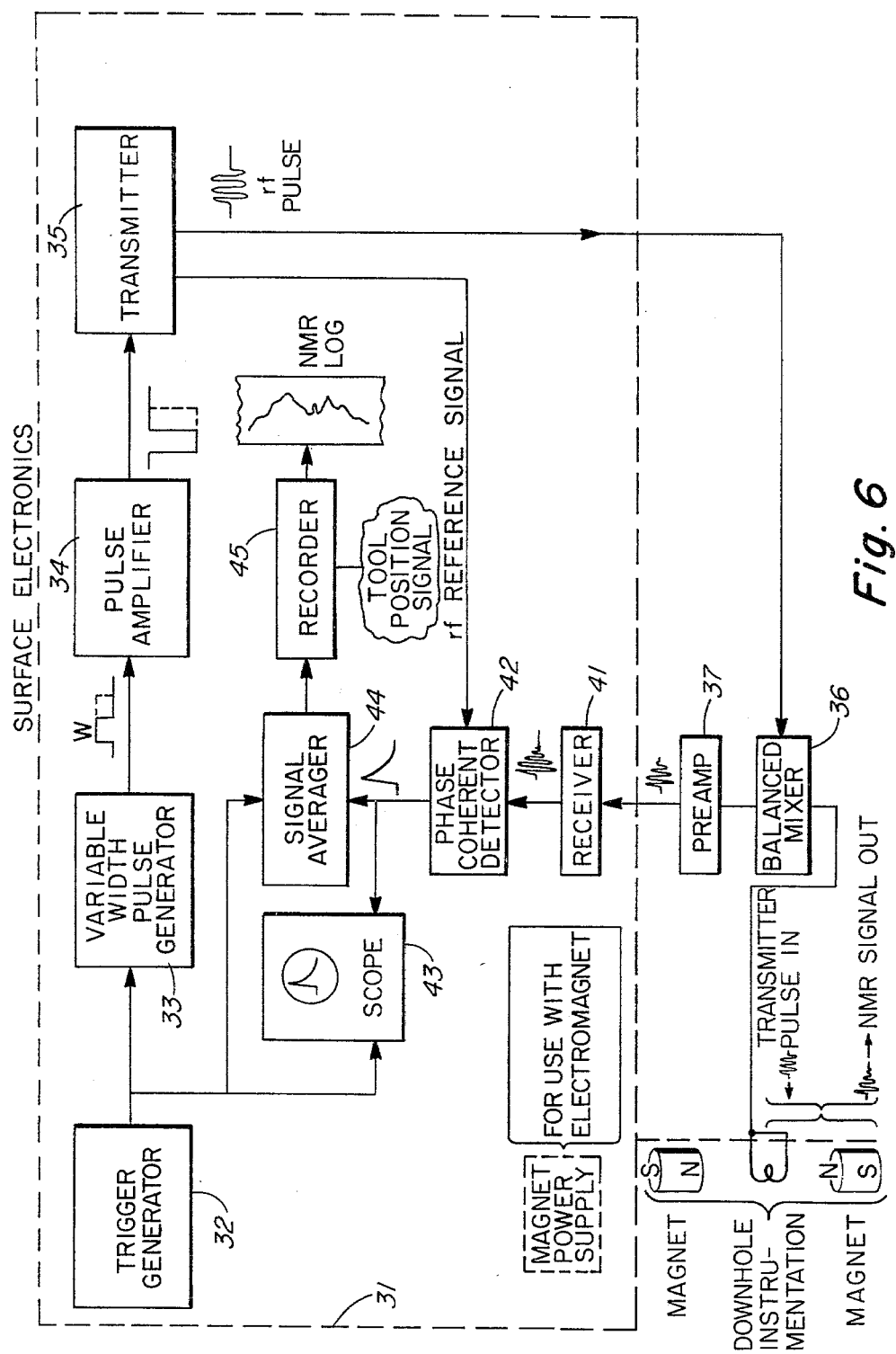
FIG. 6 illustrates the circuit of a well-logging tool employing the present invention.

Referring now to FIG. 6, the electronic equipment employed in connection with the present invention is illustrated. The surface electronics 31 includes a trigger pulse generator 32 triggering a variable width pulse generator 33. The pulse output from variable width pulse generator 33 is applied to a pulse ammplifier 34 which modulates an rf transmitter 35. The rf pulse from transmitter 35 is supplied to downhole coil 16 through an isolation network 36. Upon completion of the rf pulse from transmitter 35, a precession signal from the formation is picked up by rf coil 16 and applied through isolation network 36 to a preamplifier 37 and receiver 41. The output signal from receiver 41 is furnished to a phase coherent detector 42. The received precession signal may be viewed directly on an oscilloscope 43, which is connected to the output of phase coherent detector 42 and triggered by trigger generator 32. The received precession signal may be further processed by a signal averager 44, also triggered by trigger generator 32 and the averaged precession signal recorded on a suitable strip chart recorder 45, along with a reference signal indicating the depth of the tool. Coil 16 may be constructed to be directional, enabling mapping of fluid-filled geographical fractures in the vicinity of the borehole.

The foregoing description of the preferred embodiment of the invention has been presented for purposes of illustration and description. It is not intended to be exhaustive or to limit the invention to the precise form disclosed, and obviously many modifications and variations are possible in light of the above teaching. For example, the permanent magnets may be replaced by conventional or superconducting electromagnets or by solenoids. The above embodiment was chosen and described in order to best explain the principles of the invention and its practical application to thereby enable others skilled in the art to best utilize the invention and various embodiments and with various modifications as are suited to the particular use contemplated. It is intended that the scope of the invention be defined by the claims appended hereto.

What is claimed is:

1. Nuclear magnetic resonance equipment comprising:
   means for producing a toroidal region of homgeneous radial magnetic field;
   transmitting means for transmitting a radio frequency pulse into said toroidal region of homogeneous radial magnetic field to excite nuclei therein, and
   receiving means for receiving nuclear magnetic resonance signals from said nuclei in said toroidal region of homogeneous radial magnetic field.

2. In the nuclear magnetic resonance equipment set forth in claim 1, said first named means comprising:
   a first magnetic field source; and
   a second magnetic field source axially arranged with said first magnetic field source, said first and second magnetic field source having like poles adjacent one another.

3. In the nuclear magnetic resonance equipment set forth in claim 2, radio frequency field launching and receiving means placed between said first and second magnetic field sources.

4. In the nuclear magnetic resonance equipment set forth in claim 3, said radio frequency field launching and receiving means comprising a loop antenna forming part of said transmitting and receiving means.

5. In the nuclear magnetic resonance equipment set forth in claim 4, said first and second magnetic field sources comprising cylindrical permanent magnets.

6. In the nuclear magnetic resonance equipment set forth in claim 4, said first and second magnetic field sources comprising direct current solenoids.

7. In the nuclear magnetic resonance equipment set forth in claim 6, means enabling superconductivity in said direct current solenoids.

8. Nuclear magnetic resonance well logging equipment comprising:
 means for producing a toroidal region of homogeneous radial magnetic field surrounding a well bore; and,
 antenna means for launching a radio frequency field into said toroidal region of homogeneous radial magnetic field, and receiving a nuclear magnetic resonant signal from nuclei therein.

9. In the well logging equipment set forth in claim 8, said means for producing a toroidal region of homogeneous magnetic field comprising:
 a first magnetic field source; and
 a second magnetic field source axially arranged with said first magnetic field source, said first and second magnetic field sources having like poles adjacent one another.

10. In the well logging equipment set forth in claim 9, a radio frequency transmitter and receiver in circuit with said antenna means.

11. In the well logging equipment set forth in claim 10, isolation means in circuit between said transmitter, said receiver, and said antenna means.

12. In the well logging apparatus set forth in claim 11, pulse means for modulating said transmitter.

13. In the well logging apparatus set forth in claim 12, recording means for recording NMR signals from said receiver.

* * * * *